US008679908B1

(12) United States Patent
Chow et al.

(10) Patent No.: US 8,679,908 B1
(45) Date of Patent: Mar. 25, 2014

(54) USE OF SILICIDE BLOCK PROCESS TO CAMOUFLAGE A FALSE TRANSISTOR

(75) Inventors: Lap-Wai Chow, South Pasadena, CA (US); William M. Clark, Jr., Camarillo, CA (US); Gavin J. Harbison, Marina del Rey, CA (US); James P. Baukus, Westlake Village, CA (US)

(73) Assignees: HRL Laboratories, LLC, Malibu, CA (US); Raytheon Company, Lexington, MA (US)

( * ) Notice: Subject to any disclaimer, the term of this patent is extended or adjusted under 35 U.S.C. 154(b) by 1250 days.

(21) Appl. No.: 11/932,169

(22) Filed: Oct. 31, 2007

Related U.S. Application Data

(62) Division of application No. 11/208,470, filed on Aug. 18, 2005, now Pat. No. 7,344,932, which is a division of application No. 10/637,848, filed on Aug. 7, 2003, now Pat. No. 6,979,606.

(60) Provisional application No. 60/428,634, filed on Nov. 22, 2002.

(51) Int. Cl.
*H01L 21/338* (2006.01)

(52) U.S. Cl.
USPC .......................... 438/183; 438/184; 438/303

(58) Field of Classification Search
USPC .................................. 438/183, 184, 303
See application file for complete search history.

(56) References Cited

U.S. PATENT DOCUMENTS

| 3,673,471 A | 6/1972 | Klein et al. ................. 257/407 |
| 3,946,426 A | 3/1976 | Sanders ........................ 357/71 |
| 4,017,888 A | 4/1977 | Christie et al. ................. 357/54 |
| 4,101,344 A | 7/1978 | Kooi et al. ..................... 148/1.5 |
| 4,139,864 A | 2/1979 | Schulman ..................... 358/188 |
| 4,164,461 A | 8/1979 | Schilling ................. 204/192 EC |
| 4,196,443 A | 4/1980 | Dingwall ..................... 257/774 |
| 4,267,578 A | 5/1981 | Vetter .......................... 364/709 |
| 4,291,391 A | 9/1981 | Chatterjee et al. ........... 365/184 |
| 4,295,897 A | 10/1981 | Tubbs et al. .................. 148/1.5 |
| 4,314,268 A | 2/1982 | Yoshioka et al. ............. 357/48 |
| 4,317,273 A | 3/1982 | Guterman et al. ............ 29/571 |
| 4,322,736 A | 3/1982 | Sasaki et al. ................. 257/369 |
| 4,374,454 A | 2/1983 | Jochems ......................... 29/571 |
| 4,409,434 A | 10/1983 | Basset et al. .................. 380/265 |
| 4,435,895 A | 3/1984 | Parillo ............................ 29/571 |
| 4,471,376 A | 9/1984 | Morcom et al. ............... 357/71 |
| 4,530,150 A | 7/1985 | Shirato .................... 29/576 B |

(Continued)

FOREIGN PATENT DOCUMENTS

| EP | 0 186 855 A2 | 7/1986 |
| EP | 0 364 769 | 4/1990 |

(Continued)

OTHER PUBLICATIONS

U.S. Appl. No. 10/828,022, filed Apr. 19, 2004, Chow et al.

(Continued)

*Primary Examiner* — Phat X Cao
(74) *Attorney, Agent, or Firm* — Ladas & Parry (57) ABSTRACT

A technique for and structures for camouflaging an integrated circuit structure. A layer of conductive material having a controlled outline is disposed to provide artifact edges of the conductive material that resemble an operable device when in fact the device is not operable.

17 Claims, 4 Drawing Sheets

(56) References Cited

U.S. PATENT DOCUMENTS

| | | | | |
|---|---|---|---|---|
| 4,581,628 A | 4/1986 | Miyauchi et al. | | 357/71 |
| 4,583,011 A | 4/1986 | Pechar | | 307/440 |
| 4,603,381 A | 7/1986 | Guttag et al. | | 364/200 |
| 4,623,255 A | 11/1986 | Suszko | | 356/389 |
| 4,727,038 A | 2/1988 | Watabe | | 438/304 |
| 4,727,493 A | 2/1988 | Taylor, Sr. | | 364/490 |
| 4,753,897 A | 6/1988 | Lund et al. | | 437/41 |
| 4,766,516 A | 8/1988 | Ozdemir et al. | | 361/380 |
| 4,799,096 A | 1/1989 | Koeppe | | 357/42 |
| 4,821,085 A | 4/1989 | Haken et al. | | 357/67 |
| 4,829,356 A | 5/1989 | Arndt | | 357/35 |
| 4,830,974 A | 5/1989 | Chang et al. | | 437/34 |
| 4,939,567 A | 7/1990 | Kenney | | 257/383 |
| 4,962,484 A | 10/1990 | Takeshima et al. | | 365/226 |
| 4,975,756 A | 12/1990 | Haken et al. | | 357/4.1 |
| 4,998,151 A | 3/1991 | Korman et al. | | 257/328 |
| 5,015,596 A | 5/1991 | Toyoda et al. | | 437/41 |
| 5,030,796 A | 7/1991 | Swanson et al. | | 174/52.2 |
| 5,050,123 A | 9/1991 | Castro | | 365/53 |
| 5,061,978 A | 10/1991 | Mizutani et al. | | 357/30 |
| 5,065,208 A | 11/1991 | Shah et al. | | 357/34 |
| 5,068,697 A | 11/1991 | Noda et al. | | 357/23.5 |
| 5,070,378 A | 12/1991 | Yamagata | | 357/23.5 |
| 5,073,812 A | 12/1991 | Shimura | | 357/34 |
| 5,101,121 A | 3/1992 | Sourgen | | 307/465 |
| 5,117,276 A | 5/1992 | Thomas et al. | | 357/71 |
| 5,120,669 A | 6/1992 | Schrantz | | 437/41 |
| 5,121,089 A | 6/1992 | Larson | | 333/107 |
| 5,121,186 A | 6/1992 | Wong et al. | | 257/384 |
| 5,132,571 A | 7/1992 | McCollum et al. | | 307/465.1 |
| 5,138,197 A | 8/1992 | Kuwana | | 307/449 |
| 5,146,117 A | 9/1992 | Larson | | 307/465 |
| 5,168,340 A | 12/1992 | Nishimura | | 357/376 |
| 5,177,589 A | 1/1993 | Kobayashi et al. | | 257/773 |
| 5,202,591 A | 4/1993 | Walden | | 307/450 |
| 5,225,699 A | 7/1993 | Nakamura | | 257/306 |
| 5,227,649 A | 7/1993 | Chapman | | 257/204 |
| 5,231,299 A | 7/1993 | Ning et al. | | 257/316 |
| 5,302,539 A | 4/1994 | Haken et al. | | 437/41 |
| 5,308,682 A | 5/1994 | Morikawa | | 428/195 |
| 5,309,015 A | 5/1994 | Kuwata et al. | | 257/659 |
| 5,317,197 A | 5/1994 | Roberts | | 257/401 |
| 5,336,624 A | 8/1994 | Walden | | 437/34 |
| 5,341,013 A | 8/1994 | Koyanagi et al. | | 257/368 |
| 5,345,105 A | 9/1994 | Sun et al. | | 257/659 |
| 5,354,704 A | 10/1994 | Yang et al. | | 437/52 |
| 5,369,299 A | 11/1994 | Byrne et al. | | 257/638 |
| 5,371,390 A | 12/1994 | Mohsen | | 257/209 |
| 5,376,577 A | 12/1994 | Roberts et al. | | 437/52 |
| 5,384,472 A | 1/1995 | Yin | | 257/370 |
| 5,384,475 A | 1/1995 | Yahata | | 257/314 |
| 5,399,441 A | 3/1995 | Bearinger et al. | | 428/689 |
| 5,404,040 A | 4/1995 | Hshieh et al. | | 257/341 |
| 5,412,237 A | 5/1995 | Komori et al. | | 257/306 |
| 5,441,902 A | 8/1995 | Hsieh et al. | | 437/34 |
| 5,453,635 A | 9/1995 | Hsu | | 257/336 |
| 5,468,990 A | 11/1995 | Daum | | 257/632 |
| 5,475,251 A | 12/1995 | Kuo et al. | | 257/316 |
| 5,506,806 A | 4/1996 | Fukushima | | 365/195 |
| 5,531,018 A | 7/1996 | Saia et al. | | 29/622 |
| 5,539,224 A | 7/1996 | Ema | | 257/211 |
| 5,541,614 A | 7/1996 | Lam et al. | | 343/792.5 |
| 5,571,735 A | 11/1996 | Mogami et al. | | 437/41 |
| 5,576,988 A | 11/1996 | Kuo et al. | | 365/185.04 |
| 5,611,940 A | 3/1997 | Zettler | | 73/514.16 |
| 5,638,946 A | 6/1997 | Zavracky | | 200/181 |
| 5,677,557 A | 10/1997 | Wuu et al. | | 257/382 |
| 5,679,595 A | 10/1997 | Chen et al. | | 437/52 |
| 5,719,422 A | 2/1998 | Burr et al. | | 257/336 |
| 5,719,430 A | 2/1998 | Goto | | 257/403 |
| 5,721,150 A | 2/1998 | Pasch | | 437/46 |
| 5,783,375 A | 7/1998 | Twist | | 430/414 |
| 5,783,846 A | 7/1998 | Baukus et al. | | 257/204 |
| 5,821,147 A | 10/1998 | Kizilyalli | | 438/305 |
| 5,821,590 A | 10/1998 | Lee et al. | | 257/377 |
| 5,834,356 A | 11/1998 | Bothra et al. | | 438/384 |
| 5,838,047 A | 11/1998 | Yamauchi et al. | | 257/372 |
| 5,854,510 A | 12/1998 | Sur, Jr. et al. | | 257/529 |
| 5,858,843 A | 1/1999 | Doyle et al. | | 438/299 |
| 5,866,933 A | 2/1999 | Baukus et al. | | 257/368 |
| 5,880,503 A | 3/1999 | Matsumoto et al. | | 257/372 |
| 5,888,887 A | 3/1999 | Li et al. | | 438/525 |
| 5,895,241 A | 4/1999 | Lu et al. | | 438/275 |
| 5,920,097 A | 7/1999 | Horne | | 257/368 |
| 5,930,663 A | 7/1999 | Baukus et al. | | 438/598 |
| 5,930,667 A | 7/1999 | Oda | | 38/622 |
| 5,933,737 A | 8/1999 | Goto | | 438/291 |
| 5,973,375 A | 10/1999 | Baukus et al. | | 257/399 |
| 5,977,593 A | 11/1999 | Hara | | 257/356 |
| 5,998,257 A | 12/1999 | Lane et al. | | 438/253 |
| 6,010,929 A | 1/2000 | Chapman | | 438/226 |
| 6,037,627 A | 3/2000 | Kitamura et al. | | 257/324 |
| 6,046,659 A | 4/2000 | Loo et al. | | 333/262 |
| 6,054,659 A | 4/2000 | Lee et al. | | 200/181 |
| 6,057,520 A | 5/2000 | Goodwin-Johansson | | 200/181 |
| 6,064,110 A | 5/2000 | Baukus et al. | | 257/652 |
| 6,080,614 A | 6/2000 | Neilson et al. | | 438/238 |
| 6,093,609 A | 7/2000 | Chuang | | 438/286 |
| 6,117,762 A | 9/2000 | Baukus et al. | | 438/618 |
| 6,137,318 A | 10/2000 | Takaaki | | 326/112 |
| 6,153,484 A | 11/2000 | Donaton et al. | | 438/301 |
| 6,154,388 A | 11/2000 | Oh | | 365/185.04 |
| 6,215,158 B1 | 4/2001 | Choi | | 257/368 |
| 6,261,912 B1 | 7/2001 | Hsiao et al. | | 438/301 |
| 6,294,816 B1 | 9/2001 | Baukus et al. | | 257/368 |
| 6,326,675 B1 | 12/2001 | Scott et al. | | 257/608 |
| 6,365,453 B1 | 4/2002 | Deboer et al. | | 438/253 |
| 6,410,413 B2 | 6/2002 | Scott et al. | | 438/601 |
| 6,479,350 B1 | 11/2002 | Ling et al. | | 438/265 |
| 6,503,787 B1 | 1/2003 | Choi | | 438/214 |
| 6,740,942 B2 | 5/2004 | Baukus et al. | | 257/406 |
| 6,815,816 B1 | 11/2004 | Clark, Jr. et al. | | 257/734 |
| 7,012,273 B2 * | 3/2006 | Chen | | 257/4 |
| 7,091,114 B2 * | 8/2006 | Ito et al. | | 438/527 |
| 7,242,063 B1 | 7/2007 | Chow et al. | | 257/369 |
| 2001/0042892 A1 * | 11/2001 | Okada et al. | | 257/382 |
| 2002/0058368 A1 * | 5/2002 | Tseng | | 438/183 |
| 2002/0173131 A1 | 11/2002 | Clark, Jr. et al. | | 438/598 |
| 2003/0057476 A1 * | 3/2003 | Morita et al. | | 257/327 |
| 2003/0173622 A1 | 9/2003 | Porter et al. | | 257/355 |
| 2004/0061186 A1 | 4/2004 | Chow et al. | | 257/399 |
| 2004/0099912 A1 | 5/2004 | Chow et al. | | 257/368 |
| 2004/0144998 A1 | 7/2004 | Chow et al. | | 257/213 |
| 2004/0164361 A1 | 8/2004 | Baukus et al. | | 257/402 |

FOREIGN PATENT DOCUMENTS

| | | |
|---|---|---|
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2 486 717 | 1/1982 |
| JP | 58-190064 | 11/1983 |
| JP | 61-147551 | 7/1986 |
| JP | 63-129647 A | 6/1988 |
| JP | 02-046762 | 2/1990 |
| JP | 02-188944 | 7/1990 |
| JP | 02-237038 | 9/1990 |
| JP | 04-028092 | 1/1992 |
| JP | 10-256398 | 9/1998 |
| WO | 98/21734 | 5/1998 |
| WO | 98/57373 | 12/1998 |
| WO | 00/44012 | 7/2000 |

OTHER PUBLICATIONS

Blythe, et al., "Layout Reconstruction of Complex Silicon Chips," *IEEE Journal of Solid-State Circuits*, vol. 28, No. 2, pp. 138-145 (Feb. 1993).

Frederiksen, Thomas M., "Standard Circuits in the New CMOS Era,"

(56) References Cited

OTHER PUBLICATIONS

*Intuitive CMOS Electronics*, Revised Edition, pp. 134-146 (Jan. 1989).

Hodges and Jackson, *Analysis and Design of Digital Integrated Circuits*, 2nd edition, McGraw-Hill, p. 353 (1988).

IBM_TDB, "Double Polysilicon Dynamic Memory Cell with Polysilicon Bit Line," vol. 21, Issue No. 9, pp. 3828-3831 (Feb. 1979).

IBM_TDB, "Static Ram Double Polysilicon Process," vol. 23, Issue No. 8 pp. 3683-3686 (Jan. 1981).

Larson, L.E., et al., "Microactuators for GaAs-based Microwave Integrated Circuits," *IEEE*, pp. 743-746 (1991).

Lee, "Engineering a Device for Electron-Beam Probing," *IEEE Design and Test of Computers*, pp. 36-49 (Jun. 1989).

Ng, K.K., *Complete Guide to Semiconductor Devices*, McGraw-Hill, Inc., pp 164-165 (1995).

Sze, S.M., *VLSI Technology*, McGraw-Hill, pp. 99, 447, 461-465 (1983).

Sze, S.M., ed., "Silicides for Gates and Interconnections," *VLSI Technology*, McGraw-Hill, pp. 372-380 (1983).

\* cited by examiner

USE OF SILICIDE BLOCK PROCESS TO CAMOUFLAGE A FALSE TRANSISTOR

CROSS REFERENCE TO RELATED APPLICATIONS

This application is a divisional of U.S. patent application Ser. No. 11/208,470 filed on Aug. 18, 2005, now U.S. Pat. No. 7,344,932, which application is a divisional of U.S. patent application Ser. No. 10/637,848 filed on Aug. 7, 2003, now U.S. Pat. No. 6,979,606, which application claims the benefit of U.S. Provisional Patent Application No. 60/428,634 filed Nov. 22, 2002, the contents of which are hereby incorporated herein by reference.

This application is related to co-pending U.S. patent application Ser. No. 09/758,792 entitled "Circuit Protection Implemented Using a Double Polysilicon Layer CMOS Process" filed on Jan. 11, 2001 by J. P. Baukus, Lap Wai Chow and W. C. Clark.

TECHNICAL FIELD

The present invention relates to integrated circuits (ICs) and semiconductor devices in general and their methods of manufacture wherein the integrated circuits and semiconductor devices employ camouflaging techniques which make it difficult for the reverse engineer to discern how the semiconductor device functions.

RELATED ART

The present invention is related to the following US patents by some of the same inventors as the present inventors:

(1) U.S. Pat. Nos. 5,866,933; 5,783,375 and 6,294,816 teach connecting transistors in a CMOS circuit by implanted (and therefore hidden and buried) lines between the transistors. The implanted lines are formed by modifying the p+ and n+ source/drain masks. These implanted interconnections are used to make 3-input AND or OR circuits look substantially identical to the reverse engineer. Also, buried interconnects force the reverse engineer to examine the IC in greater depth to try to figure out the connectivity between transistors and hence their function.

(2) U.S. Pat. Nos. 5,783,846; 5,930,663 and 6,064,110 teach modifying the source/drain implant masks to provide a gap in the implanted connecting lines between transistors. The length of the gap being approximately the minimum feature size of the CMOS technology being used. If this gap is "filled" with one kind of implant, the line conducts; but if it is "filled" with another kind of implant, the line does not conduct. The intentional gaps are called "channel blocks." The reverse engineer is forced to determine connectivity on the basis of resolving the implant type at the minimum feature size of the CMOS process being used.

(3) U.S. Pat. No. 6,117,762 teaches a method and an apparatus for protecting semiconductor integrated circuits from reverse engineering. Semiconductor active areas are formed on a substrate and a silicide layer is formed over at least one active area of the semiconductor active areas and over a selected substrate area. The silicide layer connecting the at least one active area with another active area.

BACKGROUND OF THE INVENTION

The creation of complex integrated circuits and semiconductor devices can be an expensive undertaking because of the large number of hours of sophisticated engineering talent involved in designing such devices. Additionally, integrated circuits can include read only memories and/or EEPROMs into which software, in the form of firmware, is encoded. Further, integrated circuits are often used in applications involving the encryption of information. In order to keep the encrypted information confidential, devices should be protected from being reverse engineered. Thus, there can be a variety of reasons for protecting integrated circuits and other semiconductor devices from being reversed engineered.

In order to keep the reverse engineer at bay, different techniques are known in the art to make integrated circuits more difficult to reverse engineer. One technique is to make the connections between transistors difficult to determine forcing the reverse engineer to perform a careful analysis of each transistor (in particular, each CMOS transistor pair for CMOS devices), and thwarting attempts to use automatic circuit and pattern recognition techniques in order to reverse engineer an integrated circuit. Since integrated circuits can have hundreds of thousands or even millions of transistors, forcing the reverse engineer to analyze each transistor carefully in a device can effectively frustrate the reverse engineer's ability to reverse engineer the device successfully.

A conductive layer, such as silicide, is often used during the manufacture of semiconductor devices. In modern CMOS processing, especially with a minimum feature size below 0.5 µm, a silicide layer is utilized to improve the conductivity of gate, source and drain contacts. In accordance with typical design rules, any active region resulting in a source/drain region is silicided.

One reverse engineering technique involves de-layering the completed IC by means of chemical mechanical polishing (CMP) or other etching processes. The etching processes may, under some conditions, reveal the regions between where the silicide was formed on the substrate, and where it was not, i.e. the regions defined by the silicide block mask step and by regions where structures, such as a polysilicon gate, prevent the silicide layer from being deposited on the substrate. These regions may be revealed because, under some kinds of etches, there is an observable difference in topology due to different etching rates for silicided vs. pure silicon. The reverse engineer, by noting the silicided areas vs. non-silicided areas, may make reasonable assumptions as to the function of the device. This information can then be stored into a database for automatic classification of other similar devices.

Figure 1A:
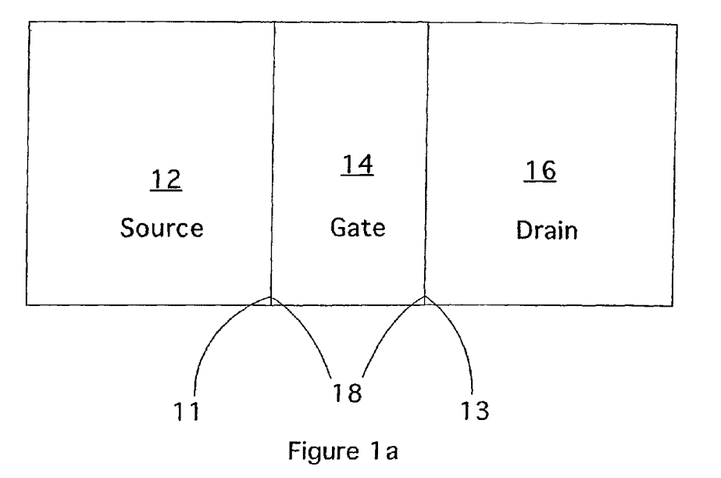
FIG. 1a depicts artifact edges of a silicide layer that the reverse engineer could see after all the metal and oxide layers have been removed from a false transistor.

Some methods of protecting against reverse engineering may be susceptible to discovery under some reverse engineering techniques, such as chemical-mechanical polishing (CMP) or other etching techniques. For example, FIG. 1a depicts a possible top-down view of a false transistor made in accordance with U.S. patent application Ser. No. 09/758,792 after etching. During the manufacturing of the false transistor, and in accordance with normal design rules, the silicide block mask allows for a silicide layer 15, see FIG. 1b, to be placed completely over the active regions 12, 16, and optionally over gate layer 14. Gate layer 14 may be a polysilicon layer. During the CMP process, the gate layer 14 would be removed, thereby resulting in the top-down view as shown in FIG. 1a. As shown, the silicide layer edge 18 aligns with the gate edge 11, 13, thus the reverse engineer only sees one line along the gate edge 11, 13.

As will be described below, the top-down view of the false transistor is different from a top-down view of a true transistor and as such, the difference may be a signature that the transistor is not a true transistor.

Figure 1B:
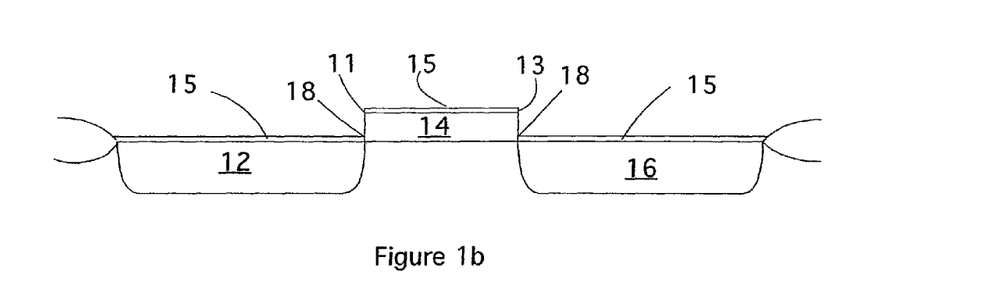
FIG. 1b depicts a cross-section of a false transistor.
Figure 2A:
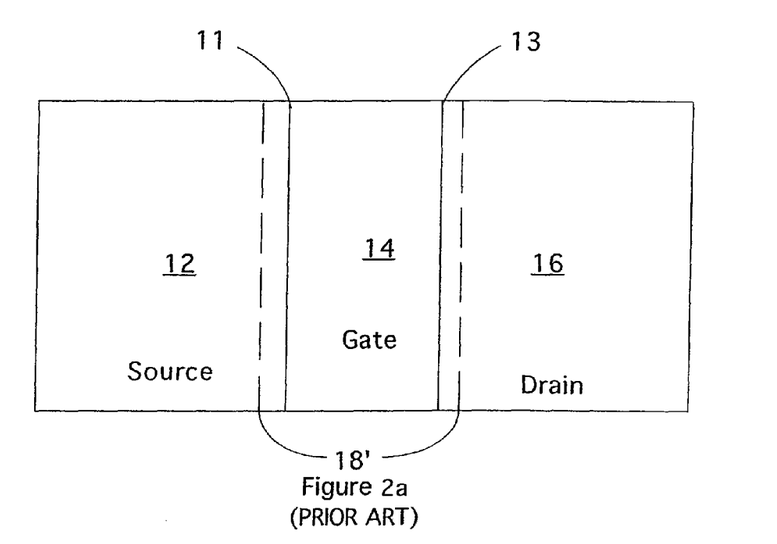
FIG. 2a depicts prior art artifact edges of a silicide layer that the reverse engineer could see after all the metal and oxide layers have been removed from a true transistor.
Figure 2B:
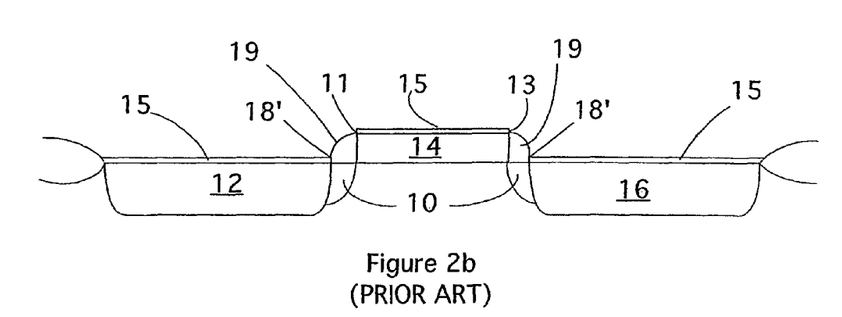
FIG. 2b depicts a cross-section of a prior art true transistor.

For functional or true transistors, as shown in FIGS. 2a and 2b, the silicide layer edge 18' is offset from the polysilicon gate layer 14 due to the presence of sidewall spacers 19 that are formed adjacent to gate layer 14. A light doped density (LDD) implant 10 is typically formed after the formation of the gate layer 14 and before the formation of the sidewall spacers. After sidewall spacers 19 are formed, active areas 12, 16 are typically formed in the substrate. The formation of active areas 12, 16 saturate most of the LDD implant, so that only the portion of the LDD implant 10 that is under the sidewall spacers 19 effectively remains. A conductive layer, such as silicide, is typically placed over the active areas 12, 16 and the gate layer 14. The gate layer 14 and sidewall spacers 19, prevent the silicide from being deposited upon the substrate in those areas. Thus, the artifact edge 18' is spaced from and lies mostly parallel with the edges 11, 13 of the gate layer 14 for a true transistor. Thus, from the examination of the top-down view the reverse engineer may be able to determine that a structure originally placed in the area was in fact a false transistor meant to confuse the reverse engineer due to the absence of artifact edges 18' lying spaced from and mostly parallel with edges 11, 13 of the polysilicon gate 14. A reverse engineer could then program computer software to recognize the absence of artifact edges 18' of the silicide layers lying separate from and being mostly parallel with the edges 11, 13 of the gate layer 14 as indications of false transistors. One skilled in the art will appreciate that although FIG. 1b depicts active regions 12, 16 adjacent to the gate region 14 and FIG. 2b depicts LDD implants 10 adjacent to the gate region 14, it is extremely difficult, if not impossible, for the reverse engineer to determine the different doping levels of the LDD implant 10 and the active regions 12, 16.

Therefore, a need exists to provide a semiconductor device and a method of manufacturing semiconductor devices that uses artifact edges to confuse the reverse engineer. Providing artifact edges that are not indicative of the actual device formed will further confuse the reverse engineer and result in incorrect conclusions as to the actual composition, and thus function, of the device.

SUMMARY OF THE INVENTION

One aspect of this invention is to make reverse engineering even more difficult and, in particular, to confuse the reverse engineer's study of the artifacts revealed during the reverse engineering process by providing artifacts that are not indicative of the underlying processing and circuit features. The result is that the reverse engineer is given large reason to doubt the validity of typical conclusions. It is believed that it will not only be time consuming to reverse engineer a chip employing the present invention but perhaps impractical, if not impossible.

Another aspect of the present invention is that it does not rely upon modifications or additions to the function of the circuitry that is to be protected from reverse engineering, nor does it require any additional processing steps or equipment. Instead, a highly effective deterrent to reverse engineering is accomplished in a streamlined manner that adds neither processing time nor complexity to the basic circuitry.

The Inventors named herein have previously filed Patent Applications and have received Patents in this general area of technology, that is, relating to the camouflage of integrated circuit devices in order to make it more difficult to reverse engineer them. The present invention can be used harmoniously with the techniques disclosed above in the prior United States Patents to further confuse the reverse engineer.

The present invention might only be used once in a thousand of instances on the chip in question. Thus, the reverse engineer will have to look very carefully at each transistor or connection. The reverse engineer will be faced with having to find the proverbial needle in a haystack.

Another aspect of the present invention is a method of manufacturing a semiconductor device in which a conductive layer block mask is modified resulting in reverse engineering artifacts that are misleading and not indicative of the true structure of the device.

An aspect of the present invention is to provide a camouflaged circuit structure, comprising: a gate layer having a first gate layer edge and a second gate layer edge; a first active area disposed adjacent said first gate layer edge; a second active area disposed adjacent said second gate layer edge; and a conductive layer having a first artifact edge and a second artifact edge, said conductive layer partially formed over said first active area and said second active area; wherein said first artifact edge of said conductive layer is offset from said first gate layer edge, and said second artifact edge of said conductive layer is offset from said second gate layer edge.

Another aspect of the present invention is a method of confusing a reverse engineer comprising the steps of: providing a false semiconductor device without sidewall spacers having at least one active region; and forming a conductive layer partially over the at least one active region such that an artifact edge of said conductive layer of said false semiconductor device without sidewall spacers mimics an artifact edge of a conductive layer of a true semiconductor device having sidewall spacers.

Another aspect of the present invention is a method of camouflaging an integrated circuit structure comprising the steps of: forming the integrated circuit structure having a plurality of active areas; and forming a conductive block layer mask to thereby form artifact edges of a conductive layer that are located in a same relative locations for non-operational transistors without sidewall spacers as well as operational transistors with sidewall spacers.

Another aspect of the present invention is a method of protecting an integrated circuit design comprising the steps of: modifying a silicide block mask used during the manufacture of a false transistor such that edges of a silicide layer for the false transistor are placed in substantially the same relative locations as edges of a silicide layer for a true transistor; and manufacturing said integrated circuit.

Another aspect of the present invention is a circuit structure comprising: a gate layer having a first gate layer edge and a second gate layer edge; a first active area, said first active area being formed during a single processing step, said first active area having a width, said first active area formed adjacent said first gate layer edge; a second active area, said second active area being formed during a single processing step, said second active area having a width, said second active area formed adjacent said second gate layer edge; a conductive layer having a first artifact edge and a second artifact edge, said conductive layer being formed over said first active area and over said second active area, a width of said conductive layer formed over said first active area being less than said width of said first active area, a width of said conductive layer formed over said second active area being less than said width of said second active area.

Another aspect of the present invention is a method of hiding a circuit function comprising the steps of: forming at least one active region of a device with a single processing step, said at least one active region having a width; and forming a conductive layer partially over the at least one active region wherein a width of said conductive layer is less than the width of the at least one active region.

DETAILED DESCRIPTION

The present invention now will be described more fully hereinafter with reference to the accompanying drawings, in which an embodiment of the invention is shown. This invention may be embodied in many different forms and should not be construed as limited to the embodiment set forth herein.

Many methods of manufacturing semiconductor devices are well known in the art. The following discussion focuses on modifying a conductive layer block mask used during the manufacture of semiconductor devices in order to confuse the reverse engineer. The discussion is not intended to provide all of the semiconductor manufacturing details, which are well known in the art.

In order to confuse the reverse engineer, the placement of an artifact edge of a silicide layer that would be seen when a reverse engineer examines devices manufactured with other reverse-engineering-detection-prevention techniques is changed. In reverse-engineering-detection-prevention techniques, false, or non-operational, transistors are used along with true, or operational, transistors. Some false transistors are manufactured without sidewall spacers, see FIG. 1b, while corresponding true transistors may well have sidewall spacers 19, as shown in FIG. 2b. From a top-down view, and through most reverse engineering techniques, these false transistors look the same as operational transistors. However, under some reverse engineering techniques, such as chemical mechanical polishing (CMP) or other etching processes, the artifact edges of the silicide layer may give away the reverse-engineering-detection-prevention technique. As shown in FIG. 1a, for some non-operational transistors, the artifact edges 18 of a silicide layer 15 coincide with the edges 11, 13 of the gate layer 14. However, with operational transistors as shown in FIG. 2a, the artifact edges 18' of a silicide layer 15 are offset from the edges 11, 13 of the gate layer 14 by the width of sidewall spacers 19.

Figure 3A:
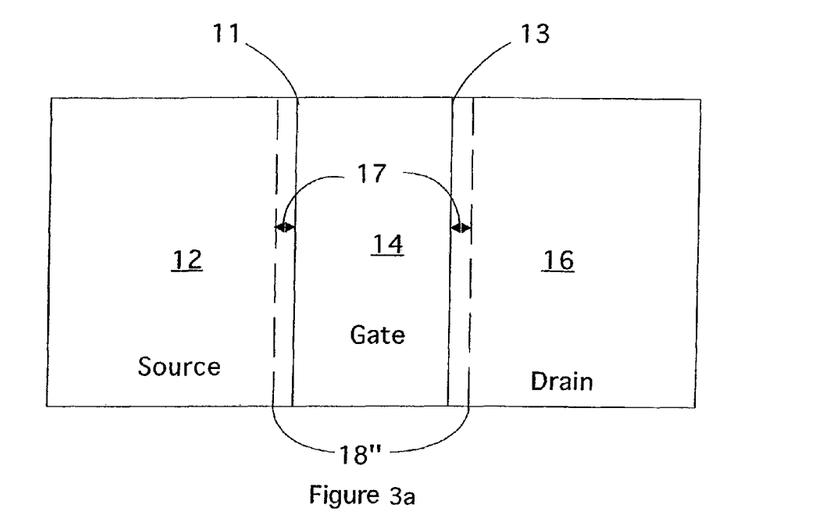
FIG. 3a depicts artifact edges of a silicide layer that the reverse engineer could see after all the metal and oxide layers have been removed from a false transistor in accordance with one embodiment of the present invention.
Figure 3B:
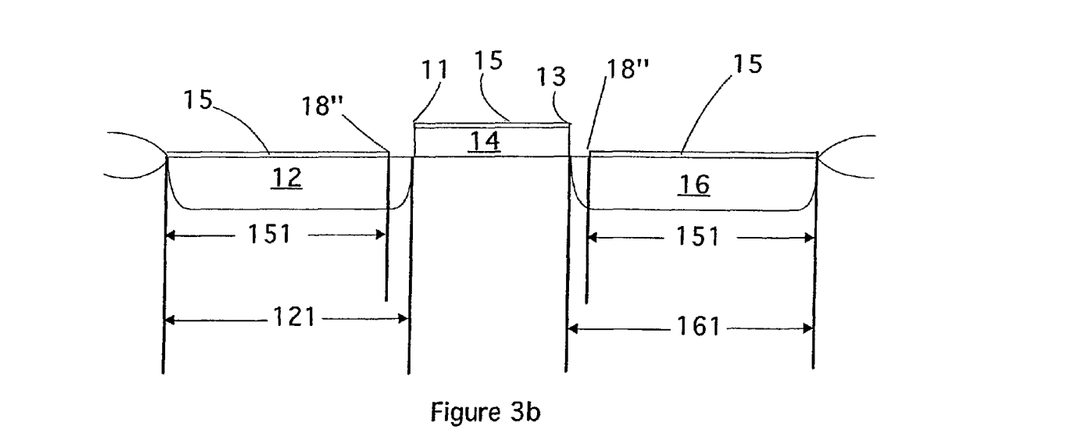
FIG. 3b depicts a cross-section of a false transistor in accordance with one embodiment of the present invention.
Figure 4:
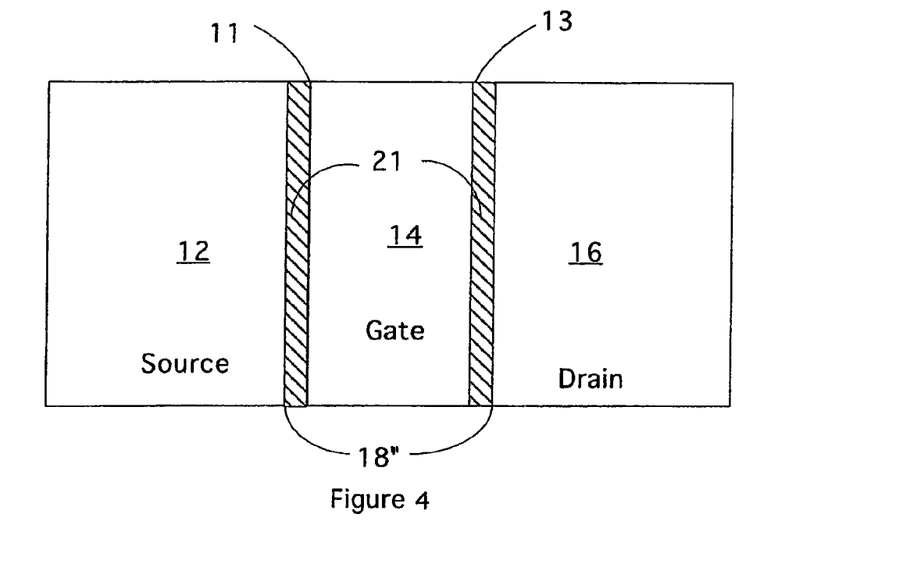
FIG. 4 depicts an example of a silicide layer block mask to be used in accordance with one embodiment of the present invention.

FIG. 3a is a top-down view and FIG. 3b is a cross-sectional view of a false transistor in accordance with the present invention. FIG. 3a depicts artifact edges 18" of a conductive layer 15 that do not coincide with the edges 11, 13 of gate layer 14. A conductive layer block mask 21, see FIG. 4, is preferably modified to prevent the silicide layer 15 from covering the entire active areas 12, 16. The conductive layer 15 is partially formed over a first active area 12 and a second active area 16. The result is that the conductive layer 15 has a cross-sectional width 151 that is smaller than the cross-sectional width 121, 161 of the active areas 12, 16. Thus, when a reverse engineering process, such as CMP or other etching process, is used, the artifact edges 18" of the conductive layer 15 do not give away the fact that the transistor is a false transistor. Instead, the artifact edges 18" are offset by a distance 17, see FIG. 3a, from the gate layer 14, with distance 17 having a width that is preferably approximately equivalent to the width of one typical sidewall spacer, as if sidewall spacers were present. Therefore, the reverse engineer can no longer rely on the placement of the artifact edges 18 of conductive layer 15 to determine if a transistor is a true transistor or a false transistor.

One skilled in the art will appreciate that the conductive layer block mask 21 will require different modifications depending on the feature size of the device. The offset distance 17 between the artifact edge 18" of the conductive layer 15 and the edge 11, 13 of the gate layer 14 is preferably approximately equal to the width of the sidewall spacers, which varies depending on the feature size of the device. One skilled in the art will appreciate that the difference between the width of the sidewall spacer 19 and the width of the offset 17 should be within the manufacturing tolerances for the process used, and thus the offset 17 and the width of the sidewall spacer 19 are approximately equal. For 0.35 μm technology, for example, the sidewall spacer width is approximately 0.09 μm. For typical CMOS processes, the conductive layer 15 will be silicide while the gate layer 14 will be polysilicon. One skilled in the art will appreciate that regardless of the feature size of the device, the person laying out the masks should place the artifact edges 18" of the conductive layer 15 for a false transistor in substantially the same relative locations as the artifact edges 18' of the conductive layer 15 for a true transistor. Thus, the reverse engineer will be unable to use the artifact edges 18 of the conductive layer 15 to determine if the transistor is a true transistor or a false transistor.

Additionally, false transistors manufactured in accordance with the invention are preferably used not to completely disable a multiple transistor circuit, but rather to cause the circuit to function in an unexpected or non-intuitive manner. For example, what appears to be an OR gate to the reverse engineer might really function as an AND gate. Alternatively, what appears as an inverting input might really be non-inverting. The possibilities are endless and are almost sure to cause the reverse engineer so much grief that he or she would give up as opposed to pressing forward to discover how to reverse engineer the integrated circuit device on which this technique is utilized.

Having described the invention in connection with certain preferred embodiments thereof, modification will now certainly suggest itself to those skilled in the art. As such, the invention is not to be limited to the disclosed embodiments, except as is specifically required by the appended claims.

What is claimed is:

1. A method of protecting an integrated circuit design comprising:
    defining a silicide block mask used during the manufacture of a false transistor such that edges of a silicide layer disposed over source and drain regions of the false transistor are placed in substantially the same relative locations as edges of a silicide layer for a true transistor; and
    manufacturing said integrated circuit using a single processing step to form said source and drain regions of said false transistor.

2. The method of claim 1, wherein the integrated circuit design has both false and true transistors and wherein the false and true transistors each have a gate region and also gate and drain regions which at least appear in plan view to be active regions associated with said gate regions.

3. A method of claim 1, wherein the edges of the silicide layer for the false transistor are placed in substantially the same relative locations adjacent a gate region, but without utilizing sidewall spacers to define said edges, as corresponding edges of the silicide layer for the true transistor with sidewall spacers.

4. The method of claim 1, wherein said single processing step forms said active regions of said false transistor each with a dopant concentration which follows a smooth curve from an adjacent gate layer edge to a central portion of each active region beneath the silicide layer.

5. The method of claim 1 wherein the single processing step to form said source and drain regions of said false transistor forms said active regions each having a dopant concentration which follows a smooth curve from an adjacent gate edge to a central portion of each respective source or drain region.

6. The method of claim 5 wherein said source and drain regions are disposed immediately on either side of a gate region with no LDD region associated therewith.

7. The method of claim 1 wherein said source and drain regions are disposed immediately on either side of a gate region of said false transistor with no LDD region associated therewith.

8. A method of hiding a circuit function of a circuit, the method comprising the steps of:
    forming at least one active region of a device with a single processing step, said at least one active region having a width; and
    forming a conductive layer partially over the at least one active region wherein a width of said conductive layer is less than the width of the at least one active region so that the conductive layer yields an artifact edge, when subjected to reverse engineering techniques, which is in a conventionally anticipated location for a conventionally operational version of the circuit, but wherein the circuit, due to the width of the at least one active region, functions in an unanticipated fashion to a reverse engineer who is unaware that said method has been practiced on said circuit.

9. The method of claim 8 wherein said device is non-operable.

10. The method of claim 8 wherein a difference between the width of the at least one active region and the width of the conductive layer is approximately equal to a width of a sidewall spacer.

11. The method of claim 8 wherein the at least one active region is disposed adjacent a channel region associated with a gate contact.

12. A method of protecting an integrated circuit design comprising:
    defining a silicide block mask used during the manufacture of a false transistor such that at least one edge of a silicide layer disposed over at least one active region of the false transistor is placed in substantially the same relative location to a gate region thereof as an edge of a silicide layer for a true transistor; and
    manufacturing said integrated circuit using a single processing step to form said at least one active region of said false transistor, the at least one active region corresponding to a source or drain region having a dopant concentration which follows a smooth curve from an adjacent gate edge to a central portion of the at least one active region.

13. The method of claim 12, wherein the integrated circuit design has both false and true transistors and wherein the false and true transistors each have a gate region and also regions which at least appear in plan view to be active regions associated with said gate regions.

14. A method of claim 12, wherein the at least one edge of the silicide layer for the false transistor is placed in substantially the same relative location, but without utilizing a sidewall spacer to define said at least one edge, as a corresponding edge of the silicide layer for the true transistor with sidewall spacers.

15. A method of protecting an integrated circuit design comprising:
    forming at least one active region in a substrate of an integrated circuit incorporating said integrated circuit design, the at least one active region having a dopant concentration which follows a smooth curve from an adjacent gate edge to a central portion of the at least one active region, the at least one active region forming a portion of a false transistor; and
    utilizing a silicide block mask during the manufacture of the false transistor such that an edge of a silicide layer disposed over said at least one active region of the false transistor is spaced from a gate of said false transistor by a gap without forming a LDD region under said gap.

16. The method of claim 15 wherein spacing the silicide layer from the gate of the false transistor yields an artifact edge when subjected to reverse engineering techniques, which artifact edge is in a conventionally anticipated location for a true transistor, but wherein the false transistor, due to an edge of the at least one active region extending beyond said artifact edge, functions in an unanticipated fashion to a reverse engineer who is unaware that said method has been practiced on said integrated circuit.

17. The method of claim 15 wherein spacing the silicide layer from the gate of the false transistor yields an artifact edge when subjected to reverse engineering techniques, the artifact edge being placed at a distance from the gate edge corresponding to a width of a conventional LDD region, said at least one active region having no LDD region associated therewith.

* * * * *